United States Patent [19]
Chao

[11] Patent Number: 6,153,936
[45] Date of Patent: *Nov. 28, 2000

[54] METHOD FOR FORMING VIA HOLE AND SEMICONDUCTOR STRUCTURE FORMED THEREBY

[75] Inventor: Shun-Hao Chao, Hsinchu, Taiwan

[73] Assignee: Winbond Electronics, Corp., Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/127,882

[22] Filed: Jul. 31, 1998

[30] Foreign Application Priority Data

Nov. 7, 1997 [TW] Taiwan ................................. 86116658

[51] Int. Cl.⁷ .......................... H01L 23/48; H01L 25/52; H01L 29/40
[52] U.S. Cl. .......................... 257/774; 257/752; 257/750; 257/758
[58] Field of Search ..................................... 257/752, 750, 257/758, 774, 786; 438/637–640, 622–626

[56] References Cited

U.S. PATENT DOCUMENTS

| | | | |
|---|---|---|---|
| 4,827,326 | 5/1989 | Altman et al. | 257/752 |
| 5,091,340 | 2/1992 | Mizushima | 438/626 |
| 5,132,774 | 7/1992 | Matsuura et al. | 257/774 |
| 5,177,588 | 1/1993 | Ii et al. | 257/640 |
| 5,189,502 | 2/1993 | Gomi | 257/759 |
| 5,470,793 | 11/1995 | Kalnitsky | 438/626 |
| 5,563,449 | 10/1996 | Dion et al. | 257/764 |
| 5,712,206 | 1/1998 | Chen | 257/529 |
| 5,729,041 | 3/1998 | Yoo et al. | 257/529 |
| 5,736,791 | 4/1998 | Fujiki et al. | 257/781 |

*Primary Examiner*—Mahshid Saadat
*Assistant Examiner*—Jhihan B Clark
*Attorney, Agent, or Firm*—Madson & Metcalf

[57] ABSTRACT

A method for manufacturing a semiconductor structure having a via hole is provided. The method includes steps of providing a base, forming a pad on the base, forming a device on the pad, forming a dielectric layer over the device and the base, executing a planarization process with etch back, and etching the dielectric layer to form the via hole. The manufactured semiconductor structure has a dielectric layer having therein the via hole, a device under the dielectrc layer, and a pad under the device for raising the device. The method and structure can prevent a residue due to planarization process from being remained between the dielectric layer and the device.

9 Claims, 8 Drawing Sheets

METHOD FOR FORMING VIA HOLE AND SEMICONDUCTOR STRUCTURE FORMED THEREBY

FIELD OF THE INVENTION

The present invention is related to a method for forming a semiconductor structure having a via hole and the semiconductor structure formed by the same method, and more particularly to a method for forming a semiconductor structure by a planarization process and the semiconductor structure formed by the same method.

BACKGROUND OF THE INVENTION

At modern age, the semiconductor device becomes smaller and smaller because of the improvement of the manufacturing technology from micron, sub-micron to deep sub-micron. According to the requirement of the accuracy, the backend planarization process gets more important. The so-called planarization process is a process for planarizing the uneven surface of a dielectric layer to obtain a smooth surface. After the planarization process, the dielectric layer has a more smooth surface. Thus, the subsequent processes for forming other layers over the dielectric layer become easier and the patterns transferring to the layers are more reliable. The most often used backend planarization processes are spin-on-glass (SOG) process and chemical mechanical polishing (CMP) process. These processes can provide a locally or globally planarized surface and are suitable for recent semiconductor manufacturing process. The spin-on-glass process can fill gap well so that it is adopted widely to manufacture semiconductor devices. The spin-on-glass processes are further classified into two types, with and without etch-back step. The former can prevent the spin-on-glass layer from outgassing when curing the spin-on-glass layer. However, it is still disadvantageous to adopt such backend planarization process. If the area of the metal under the dielectric layer is larger than $3.0\,\mu m \times 3.0\,\mu m$, there is always residue spin-on-glass on the metal line. The residue will seriously affect the quality of the semiconductor device.

FIG. 1 shows the conventional method for manufacturing a semiconductor structure having a via hole. Please refer to FIG. 1(A). At first, a metal layer 11 is deposited on a half-finished semiconductor device 10. The half-finished semiconductor device 10 may be a complementary metal-oxide semiconductor (CMOS) formed by a conventional process. Secondly, as shown in FIG. 1(B), a typical etching step is executed. The etching step includes a) depositing a photoresist layer 12 on the metal layer 11, b) transferring pattern to the photoresist layer 12 by photolithography, c) etching the metal layer 11 to form a relatively broad metal line 111 and a relatively narrow metal line 112, and d) stripping the photoresist layer 12.

Figure 1A:
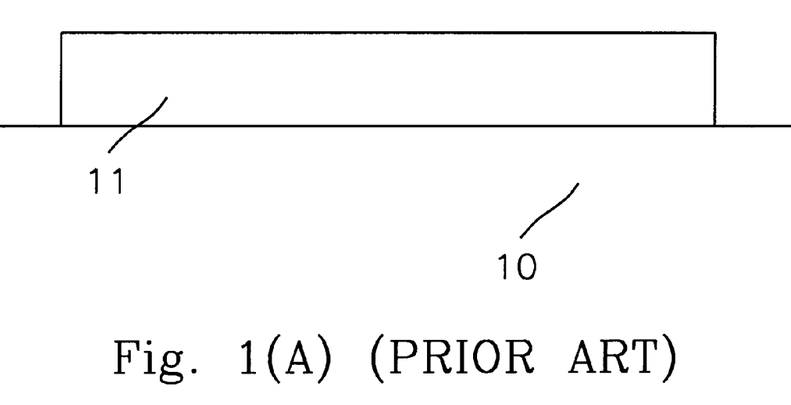
FIGS. 1(A)–1(G) are schematic diagrams showing a conventional process for manufacturing a semiconductor structure.
Figure 1B:
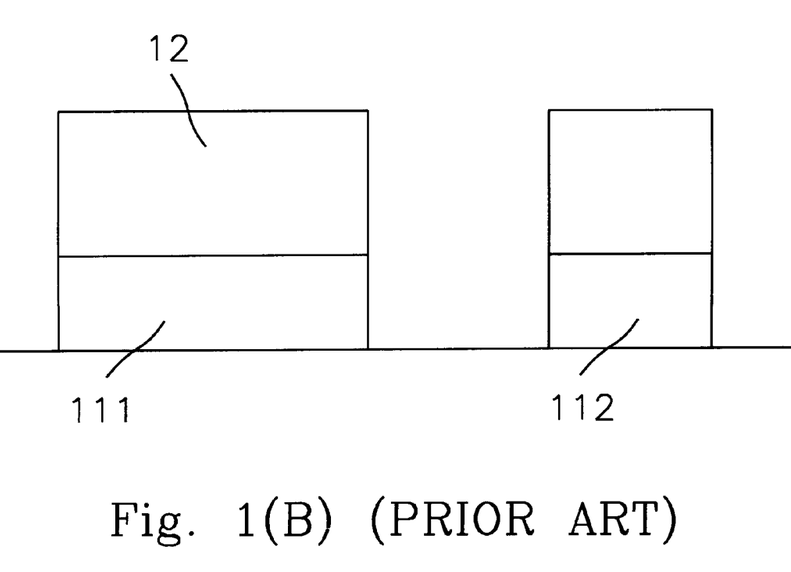
Figure 1C:
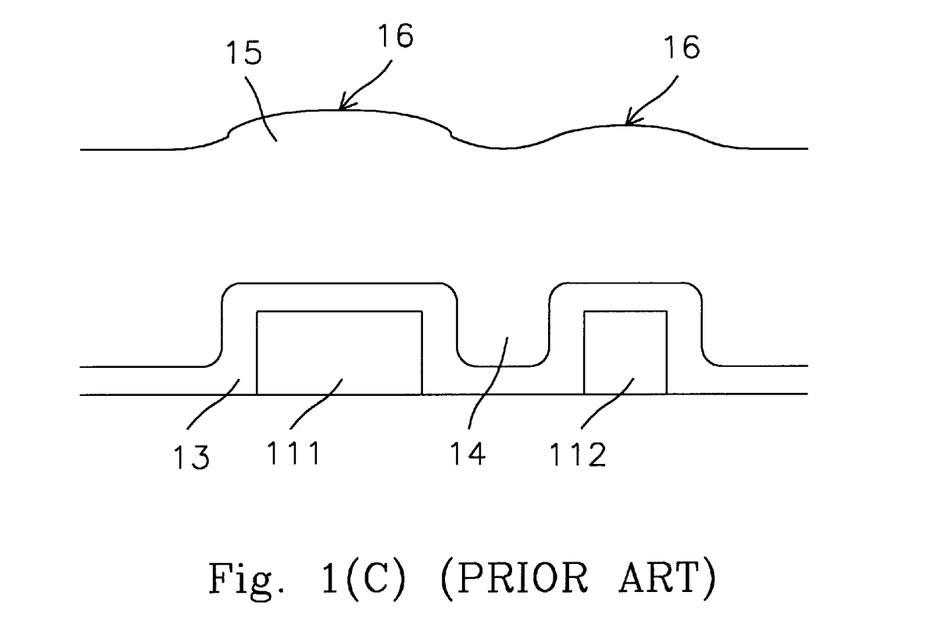
Figure 1D:
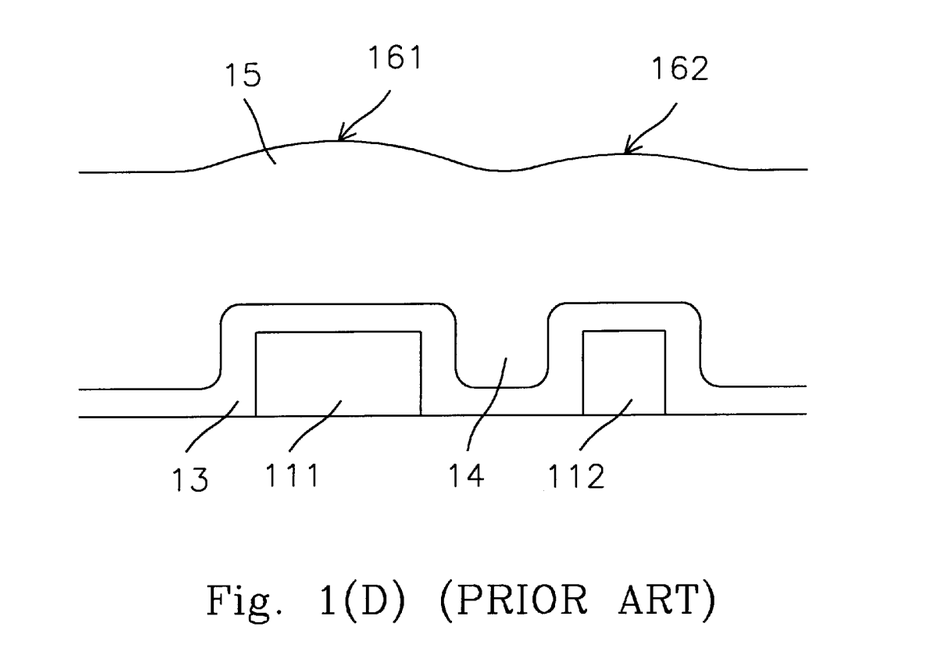

Thirdly, referring to FIG. 1(C), a dielectric layer 13 is deposited over the metal lines 111 and 112. The dielectric layer 13 is usually a silicon dioxide ($SiO_2$) layer with a thickness of 2000 Å. Plasma enhanced chemical vapor deposition (PECVD) is the most often used method to deposit the dielectric layer 13 because of its relative low reaction temperature, good step coverage ability, and low residuary stress of the deposited layer. There is a gap 14 formed between the metal lines 111 and 112. Then, the spin-on-glass process is used for filling the gap 14. The thickness of the spin-on-glass layer 15 is about 5000 Å. However, there are still protrusions 16 right over the metal lines 111 and 112. Please refer to FIG. 1(D). After curing the spin-on-glass layer 15, reflow occurs so that the spin-on-glass layer 15 becomes planarized, but not fully even. The protrusion 161 right over the broad metal line 111 is thicker than the protrusion 162 right over the narrow metal line 112.

Figure 1E:
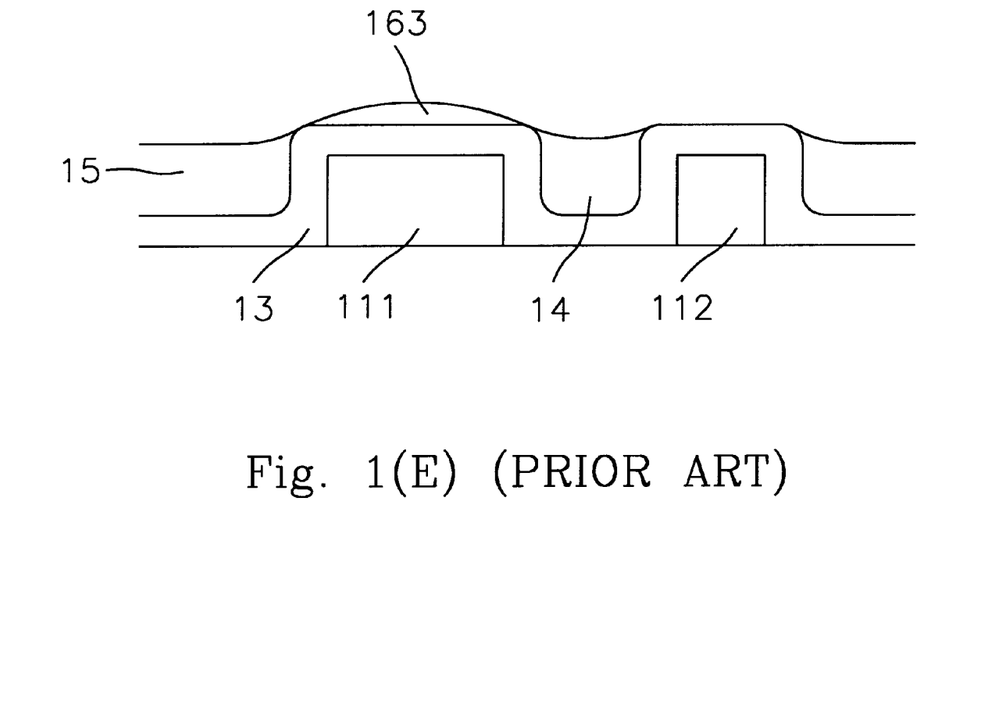
Figure 1F:
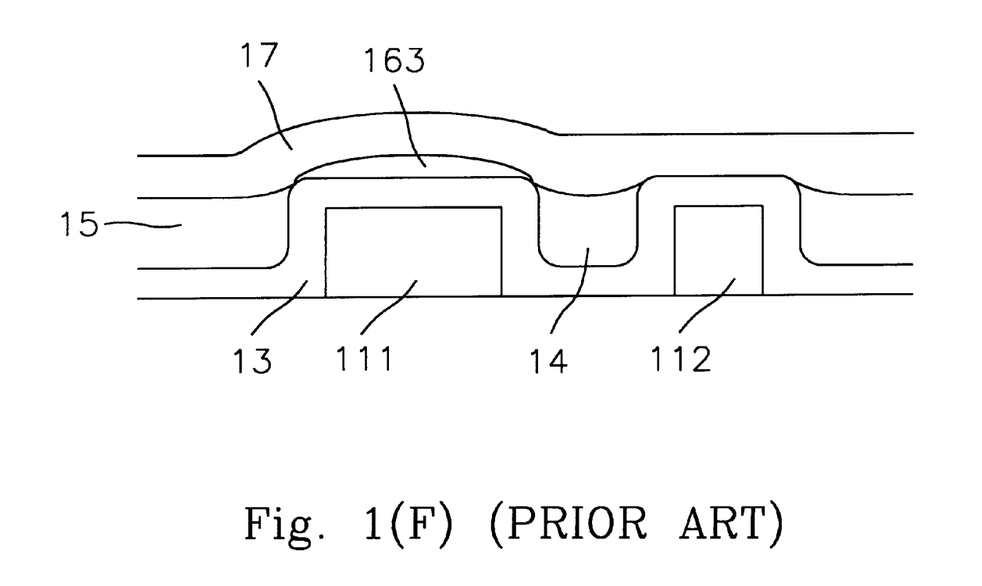
Figure 1G:
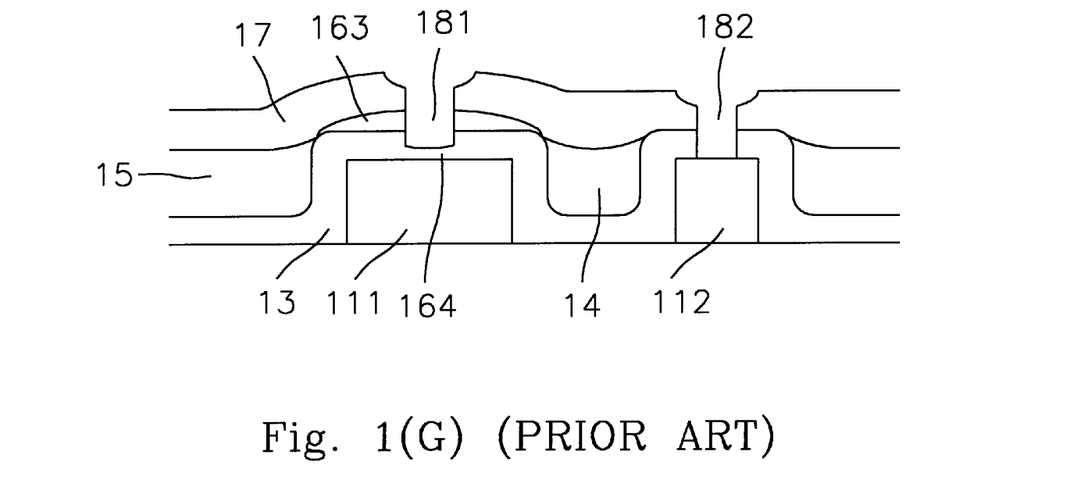

Please refer to FIG. 1(E). The etch-back step is executed to remove the upper portion of the spin-on-glass layer 15. The spin-on-glass layer 15 right over the metal lines 111 and 112 must be fully removed. However, it is difficult to remove completely when the area of the metal line is larger than $3.0\,\mu m \times 3.0\,\mu m$. Because the protrusion 161 right over the broad metal line 111 is thicker than the protrusion 162 right over the narrow metal line 112, there must be a residue 163 remained over the broad metal line 111 after the etch-back step. Then, referring to FIG. 1(F), the plasma enhanced chemical vapor deposition is executed again to deposit another silicon dioxide layer 17 with a thickness of 5000 Å over the spin-on-glass layer 15. The spin-on-glass layer 15 and two silicon oxide layers 13 and 17 constitute the so-called sandwich type structure. The planarization process is completed and a locally planarized surface is obtained.

Multilevel metallization schemes play an important role in very-large-scale integration (VLSI) technology because they provide additional surface area on which interconnections can be made. In order to perform the multilevel metallization, a via plug is necessary for connecting different metal lines. Please refer to FIG. 1(G). The via holes 181 and 182 are formed on the metal lines 111 and 112 for positioning the via plugs. The problem is that the residue 163 is exposed to the environment. The residue 163 which has a silicon dioxide-like property will absorb moisture so that the residue 163 will expand and deform. If the exposure of the residue 163 takes too much time, e.g. more than 6 hours, the reliability and quality of the device is seriously affected. The competitive ability of such devices must be reduced. Increasing the etch-back time has been proposed to fully remove the residue. However, the other portion of the spin-on-glass layer is thinned by this way and it can not provide good insulation any more. Another problem is that the residue 163 increases the depth of the via hole 181. The etching step can not be well controlled to completely remove the dielectric layer 13 in the via hole 181 because the thickness of residue 163 can not be easily controlled. There is residuary dielectric material 164 remained in the via hole 181. Therefore, the electrical connection between two metal layers is seriously affected. It is really disadvantageous to the development of multilevel metallization. The performance of the subsequent planarization is also seriously affected.

SUMMARY OF THE INVENTION

An objective of the present invention is to provide a method for manufacturing a semiconductor structure having a via hole to prevent the residue from being remained in the structure.

Another objective of the present invention is to provide a method for manufacturing a semiconductor structure having a via hole without reducing the thickness of the dielectric layer.

Another further objective of the present invention is to provide a method for manufacturing a semiconductor structure having a via hole without affecting the performance of the subsequent planarization.

Another further objective of the present invention is to provide a semiconductor structure having a via hole of good reliability.

In accordance with the present invention, the manufacturing method includes the following steps. At first, a base is provided and a pad is formed on the base. Secondly, a device is formed on the pad. Thereafter, a dielectric layer is formed over the device and the base. Subsequently, a planarization process is executed with etch-back. At last, the via hole is formed through the dielectric layer. The via hole is used for positioning a via plug electrically connected to the device. The pad formed in the first step is used to slightly raise the device formed in the second step. It is advantageous to the subsequent planarization process. Hence, there is no residue formed on the device. Another advantage is that the dielectric layer can be completely removed from the via hole.

In accordance with another aspect of the present invention, the pad is formed by depositing a layer on the base and etching the undesired portion of the layer. The pad may be made of a conducting material or an insulating material according to the requirement. The thickness is ranged from 100 Å to 10000 Å.

In accordance with another aspect of the present invention, the device is fabricated by forming another layer on the pad and etching the undesired portion of the layer. The best method for forming the layer is a sputtering method. The device should be made of a conducting material such as aluminum (Al).

In accordance with another aspect of the present invention, the dielectric layer is preferably a silicon dioxide layer to insulate the conducting elements. The subsequent planarization process is a spin-on-glass process with etch-back. Later, the via hole is formed by etching the dielectric layer.

In accordance with the present invention, the semiconductor structure, manufactured by the above-described method, includes a base, a pad, a device, and a dielectric layer from down to up in sequence. A via hole is also formed on the dielectric layer. The pad is used for raising the device to prevent a residue from being remained between the dielectric layer and the device. The pad may be made of a conducting material or an insulating material according to the application. The size of the pad is preferably ranged from 0.5 μm×0.5 μm to 2.5 μm×2.5 μm if the area of the device is larger than 3.0 μm×3.0 μm.

In accordance with another aspect of the present invention, the device is a conducting device made of metal such as aluminum. Its thickness may be ranged from 100 Å to 10000 Å.

In accordance with another aspect of the present invention, the semiconductor structure further includes a sandwich type structure for planarizing the semiconductor structure. The sandwich type structure includes the above-mentioned dielectric layer, a spin-on-glass-layer, and another dielectric layer. Both of the dielectric layers may be silicon dioxide layers, and the spin-on-glass layer may be made from silicate or siloxane.

The present invention may best be understood through the following description with reference to the accompanying drawings, in which:

DETAILED DESCRIPTION OF THE PREFERRED EMBODIMENT

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

In order to avoid the disadvantages encountered in the prior art, the key point is to prevent the spin-on-glass layer from being exposed to the environment. Hence, the spin-on-glass layer can not be remained at the position where a via hole will be formed. The steps are now described in detail to understand the present invention clearly.

Figure 2A:
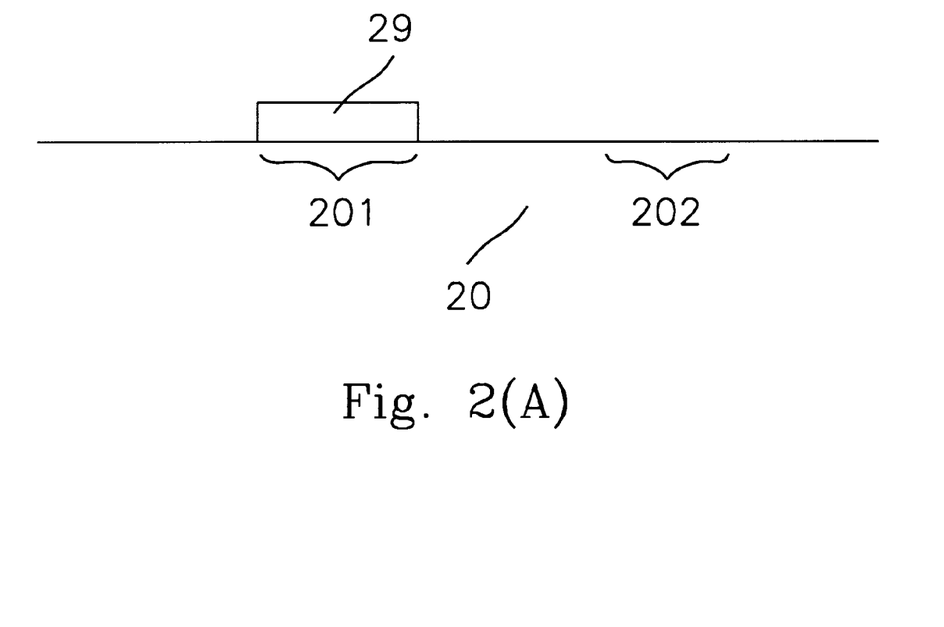
FIGS. 2(A)–2(G) are schematic diagrams showing a preferred embodiment of a process for manufacturing a semiconductor structure according to the present invention.

Please refer to FIG. 2(A). In this preferred embodiment, two via holes will be formed for positioning the via plugs. We assume that one of the metal lines under the via plugs has a relatively large area, e.g. exceed 3.0 μm×3.0 μm according to the designed pattern. This metal line with a relatively large area is formed on the position 201 of the substrate 20, and the other one with a smaller size is formed on the position 202. The first step is to form a pad 29 on the position 201. The pad 29 is formed by depositing a layer over the substrate 20 and etching the layer but remaining a portion (pad 29) on the position 201. The pad 29 may be a conductor or an insulator according to the requirement. For example, if the pad 29 is expected to insulate the neighbor layers, the pad 29 must be an insulator. As for the size of the pad 29, it can be changed according to the area of the metal line. The area of the pad 29 is usually ranged from 0.5 μm×0.5 μm to 2.5 μm×2.5 μm.

Figure 2B:
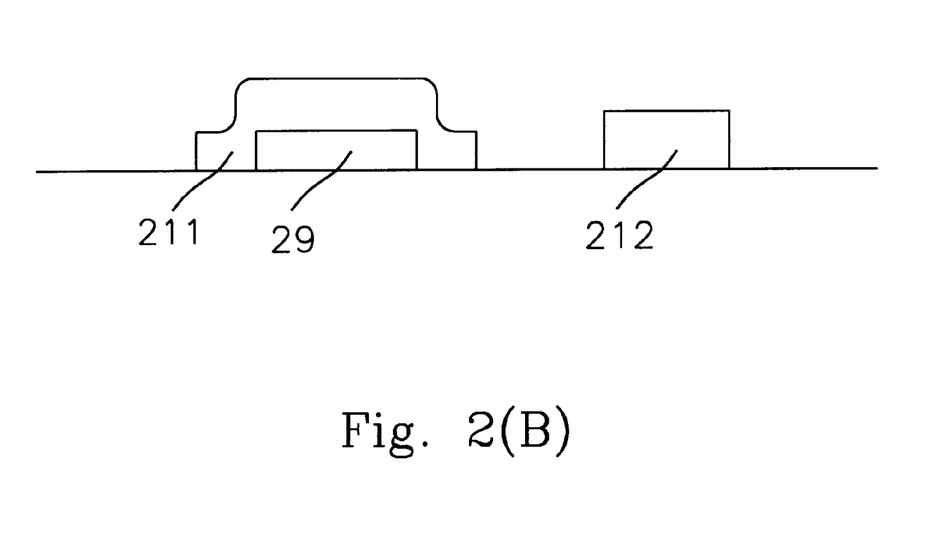
Figure 2C:
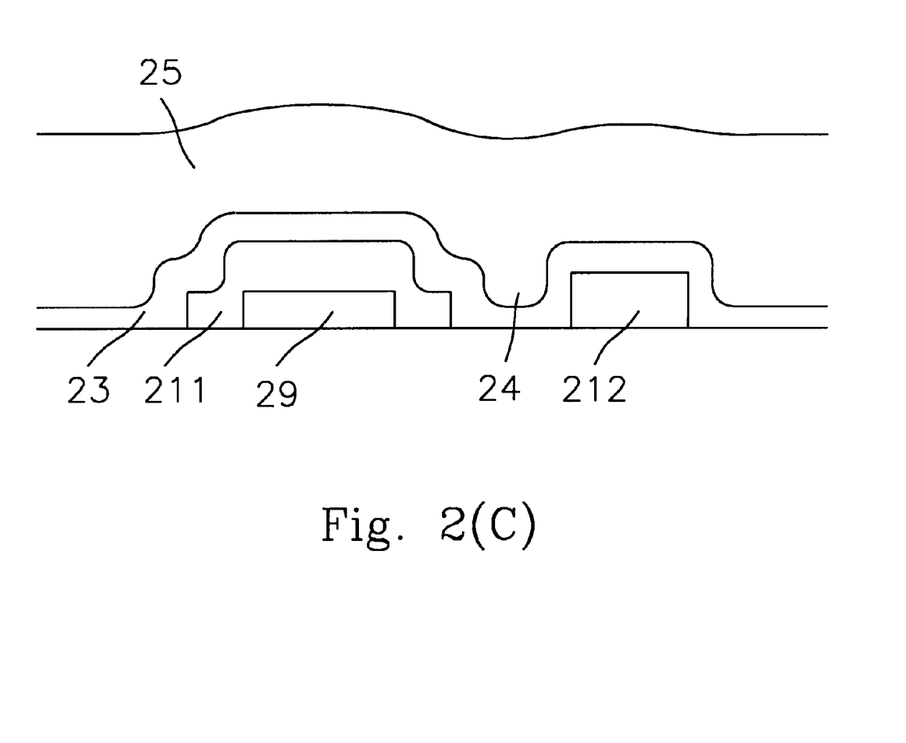

Please refer to FIG. 2(B). The metal lines 211 and 212 are formed on the pad 29 and the position 202 respectively. The first step is to form a metal layer over the pad 29 and the substrate 20. If the metal layer is an aluminum layer, sputtering process may be the preferable method to form the layer. If the metal layer is made of tungsten (W), low pressure chemical vapor deposition (LPCVD) may be a better choice. Then, photolithography is executed to transfer the designed pattern. After etching undesired portion of the metal layer, two metal lines 211 and 212 are formed. The wide metal line 211 is relatively higher than the narrow metal line 212.

The steps with reference to FIGS. 2(C)–2(G) are the same as those described in FIGS. 1(C)–1(G). Please refer to FIG. 2(C). The dielectric layer 23 is deposited over the metal lines 211 and 212. Silicon dioxide and silicon nitride ($Si_3N_4$) are often used as dielectric materials. Specially, silicon dioxide is the most often used because of its lower dielectric constant. Thus, the silicon dioxide layer 23 is usually formed by plasma enhanced chemical vapor deposition. The deposition temperature is ranged from 300 to 400° C., and the deposition pressure is ranged from 0.1 to 5 torr. The formed silicon dioxide layer 23 has a thickness of 2000 Å. Then, the gap 24 is filled by spin-on-glass process. The liquid source for spin-on-glass process includes a solvent and a silicon network-containing material. The solvent may be alcohol or ketone. There are two kinds of silicon network-containing materials. They are silicate and siloxane. If silicate is used as the raw material, phosphorus pentoxide ($P_2O_5$) is usually doped to prevent the spin-on-glass layer 25 from being cracked. As for siloxane, the organic functional group can increase the resistance against crack. The steps include spin coating and curing. The spin coating step is used to distribute the dielectric material over the structure, and the curing step is used to remove the excess of solvent and generate silicon-oxygen bonds. The curing temperature is usually from 80° C. to 300° C. The formed spin-on-glass layer 25 is about 2000 Å to 5000 Å. There are still protrusions over the position of metal lines 211 and 212. The thickness of the spin-on-glass layer 25 over the metal lines 211 and 212 is the same. Because the metal line 211 is higher than the metal line 212, the top of spin-on-glass layer 25 over the metal line 211 is also higher than that over the metal line 212.

Figure 2D:
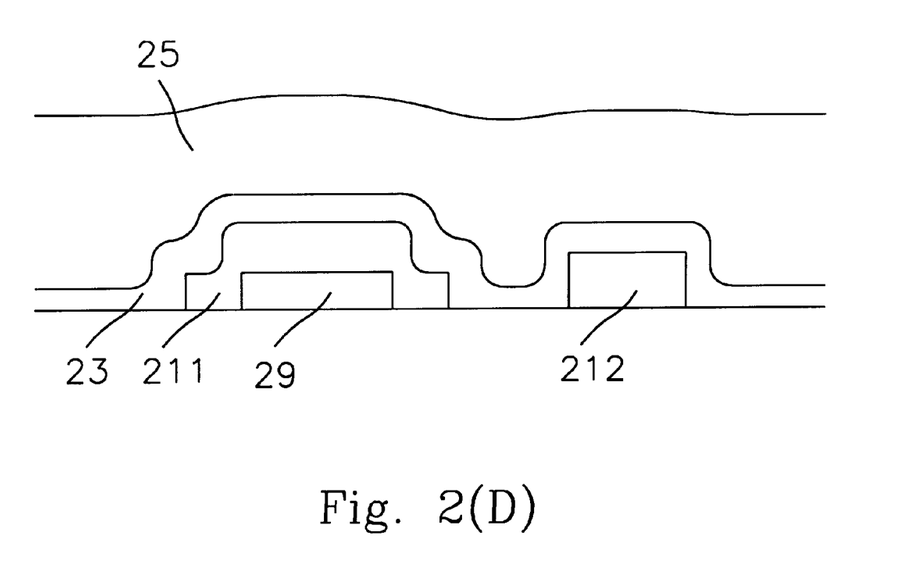

Please refer to FIG. 2(D). The spin-on-glass layer 25 reflows under heat treatment. The thickness of the spin-on-glass layer 25 over the metal line 211 is thinner than that over the metal line 212. Hence, the spin-on-glass layer 25 becomes more smooth than that formed in the prior art. It is of great advantage to proceed the subsequent steps.

Figure 2E:
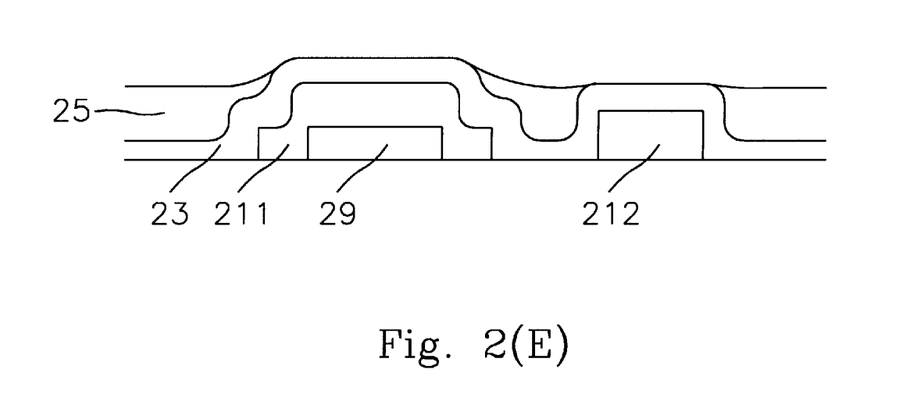

Please refer to FIG. 2(E). The upper portion of the spin-on-glass layer 25 is removed by etch-back step. Because the metal line 211 is raised by the step 29, the thickness of the spin-on-glass layer 25 over the metal line 211 is properly adjusted. After executing the etch-back step, it is found that there is no residuary spin-on-glass layer over the metal line 211.

Figure 2F:
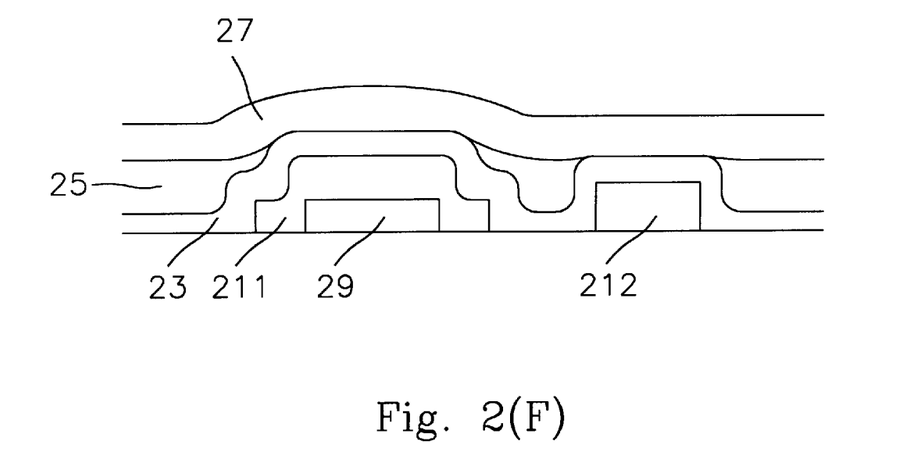

Please refer to FIG. 2(F). Another silicon dioxide layer 27 is deposited over the spin-on-glass layer 25. The preferable deposition method is plasma enhanced chemical vapor deposition. The spin-on-glass layer 25 and two silicon oxide layers 23 and 27 constitute the so-called sandwich type structure. Thus, the planarization process is almost completed.

Figure 2G:
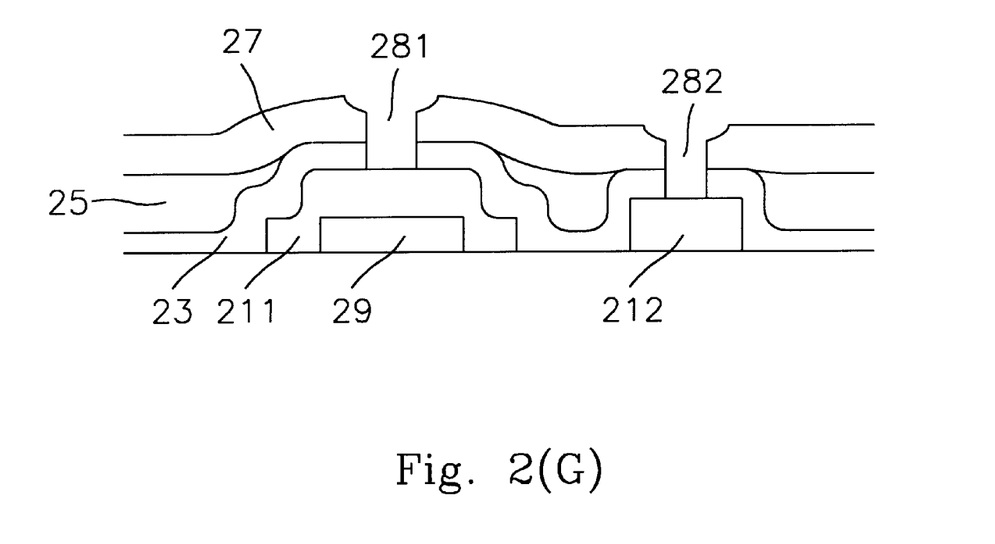

Please refer to FIG. 2(G). Before the structure is applied to the multilevel metallization, a via plug must be formed to provide a contact between different metal layers. Therefore, the dielectric layers 27 and 23 over the metal lines 211 and 212 is etched to provide two via holes 281 and 282. The etching type is selected according to the type of the via plug. If the via plug is an aluminum plug, wet etching following by dry etching is executed to compensate for the worsen step coverage ability of aluminum. Otherwise, if the via plug is a tungsten (W) plug, the dielectric layers 27 and 23 are etched by anisotropic etching, i.e. dry etching. There is no residue exposed to the environment. The spin-on-glass layer 25 will not be exposed to the moisture. There is not residuary dielectric layer shown in the via hole 281. The manufacturers do not have to worry about the above-described questions such as deformation and expansion of the residue resulting in lower reliability and quality of the semiconductor structure. They do not have to worry about the quality of electrical connections between two metal layers, either.

The present invention also provides a special semiconductor structure formed by the above-described method. Please refer to FIG. 2(G). The semiconductor structure includes a pad 29 to raise the relatively broad metal line 211. There is a sandwich structure including a silicon dioxide layer 27, a spin-on-glass layer 25, and another silicon dioxide layer 23 in sequence from up to down for planarizing the structure, but there is no spin-on-glass layer right over the relatively broad metal line 211. Only two silicon dioxide layers 27 and 23 containing a via hole 281 therethrough are deposited right over the relatively broad metal line 211. The spin-on-glass layer 25 is not exposed in the via hole 281. This semiconductor structure solves the problem encountered by the prior art.

In the industry of manufacturing the semiconductor, because the multilevel metallization process can significantly reduce the size of the semiconductor device, this technology is used widely. It is inevitable to form via holes in semiconductor devices. Then, tungsten plug or aluminum plug can be positioned in the via holes to provide an electrical contact between different metal layers. It is apparent that etching a via hole is with considerable frequency even in manufacturing a small chip. According to the prior art, every time when etching a via hole, the reliability of this chip is affected. This will decrease the yield rate without doubt. The present invention provide the manufacturing method and semiconductor structure which can easily solve such problems. Accordingly, the present invention is very useful in increasing the yield rate of multilevel semiconductor devices. Moreover, the present invention can be applied to other processes. On the condition that the planarization process has an etch-back step for a relatively large area which the residue is possibly remained thereon, the present method and structure can be adopted to keep the reliability.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor structure having a first and a second via hole comprising:

a first dielectric layer having therein said first and second via holes;

a first and a second metal line formed under said first and second via holes, respectively, wherein said first and second metal lines define respective areas, the area of said first metal line being larger than that of said second metal line;

a gap-filling layer formed beside, and being not higher than, said first and second metal lines for planarizing said semiconductor structure; and a pad formed under said first metal line for raising said first metal line to prevent said gap-filling layer from being exposed to said via hole.

2. A semiconductor structure according to claim 1 wherein said first dielectric layer is a silicon dioxide layer.

3. A semiconductor structure according to claim 1 wherein said pad has a rectangular shape having an area ranged from 0.5 $\mu$m×0.5 $\mu$m to 2.5 $\mu$m×2.5 $\mu$m.

4. A semiconductor structure according to claim 1 wherein said semiconductor structure further comprises a base under said pad and said first dielectric layer.

5. A semiconductor structure according to claim 3 wherein said pad is made of one of a conducting material and an insulating material.

6. A semiconductor structure according to claim 4 wherein said semiconductor structure further comprises a second dielectric layer, and said gap-filling layer is a third dielectric layer formed by a spin-on-glass process between said base and said first dielectric layer for planarizing said semiconductor structure, wherein said first dielectric layer, said third dielectric layer, and said second dielectric layer constite a sandwich type structure.

7. A semiconductor structure according to claim 6 wherein said third dielectric layer is made from one of a silicate and a siloxane.

8. A semiconductor structure according to claim 6 wherein said base comprises a substrate for supporting said first dielectric layer, said second dielectric layer said third dielectric layer, and said pad.

9. A semiconductor structure having a via hole comprising:

a first dielectric layer having therein said via hole;

a metal line formed under said via hole, wherein the metal line defines an area larger than about 3 $\mu$m×3 $\mu$m;

a gap-filling layer formed beside, and being not higher than, said metal line for planarizing said semiconductor structure; and a pad formed under said metal line for raising said metal line to prevent said gap-filling layer from being exposed to said via hole.

* * * * *